United States Patent [19]

Mayer

[11] Patent Number: 5,122,391
[45] Date of Patent: Jun. 16, 1992

[54] METHOD FOR PRODUCING HIGHLY CONDUCTIVE AND TRANSPARENT FILMS OF TIN AND FLUORINE DOPED INDIUM OXIDE BY APCVD

[75] Inventor: Bruce E. Mayer, Soquel, Calif.
[73] Assignee: Watkins-Johnson Company, Palo Alto, Calif.
[21] Appl. No.: 668,858
[22] Filed: Mar. 13, 1991
[51] Int. Cl.$^5$ .................................................. B05D 5/12
[52] U.S. Cl. .......................... 427/126.3; 427/109; 427/124; 427/252; 427/253; 427/255.3; 427/255.4; 427/299; 427/314
[58] Field of Search .............. 427/126.3, 109, 124, 427/252, 253, 255.3, 255.4, 299, 314

[56] References Cited

PUBLICATIONS

Gralenski, N. "Advanced APCVD Reactors for Thin Film Deposition," *Microelectronic Mfg. & Testing*, Sep.-/Oct., 1987.
"Thin Films by Conveyorized Atmospheric CVD," presented at the International Society for Hybrid Microelectronics-Internepcon Tech. Sem., Jan. 1983.

*Primary Examiner*—Bernard Pianalto
*Attorney, Agent, or Firm*—Thomas E. Schatzel

[57] ABSTRACT

An atmospheric pressure chemical vapor deposition (APCVD) system for doping indium-oxide films with both tin and fluorine to produce dual electron donors in a non-batch process. The APCVD system has a conveyor belt and drive system for continuous processing through one or more reaction chambers separated by nitrogen purge curtains. A substrate passing through the system enters a muffle heated by several heaters and the reaction chambers are supplied by a source chemical delivery system comprising an oxidizer source, a fluorine chemical source, a nitrogen source, rotometers for the above sources, a mass flow controller, a tin chemical bubbler, heated lines, an indium chemical bubbler, a pair of water baths with heaters, and associated valving.

8 Claims, 3 Drawing Sheets

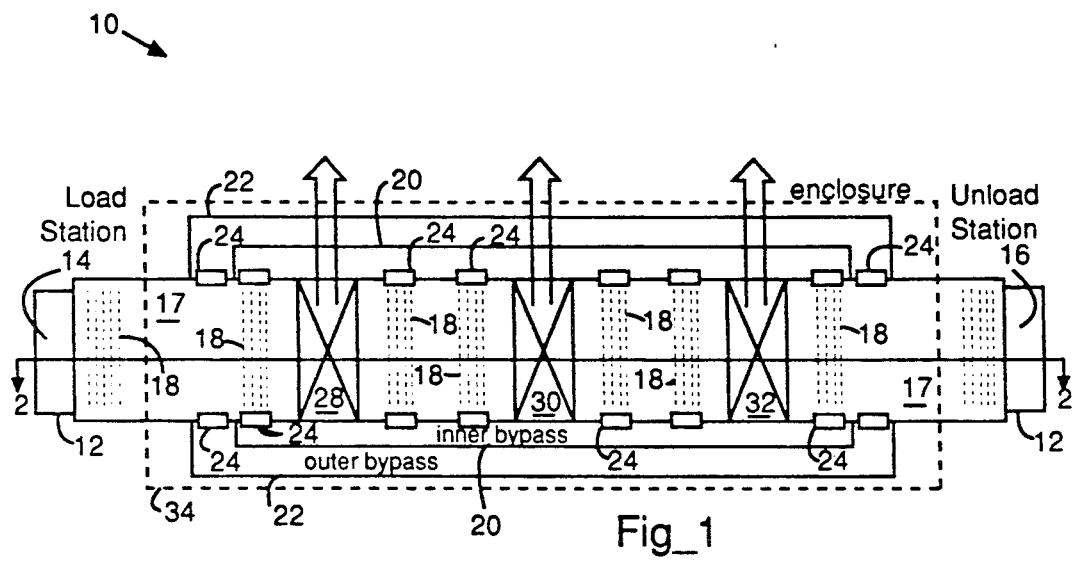
Fig_1
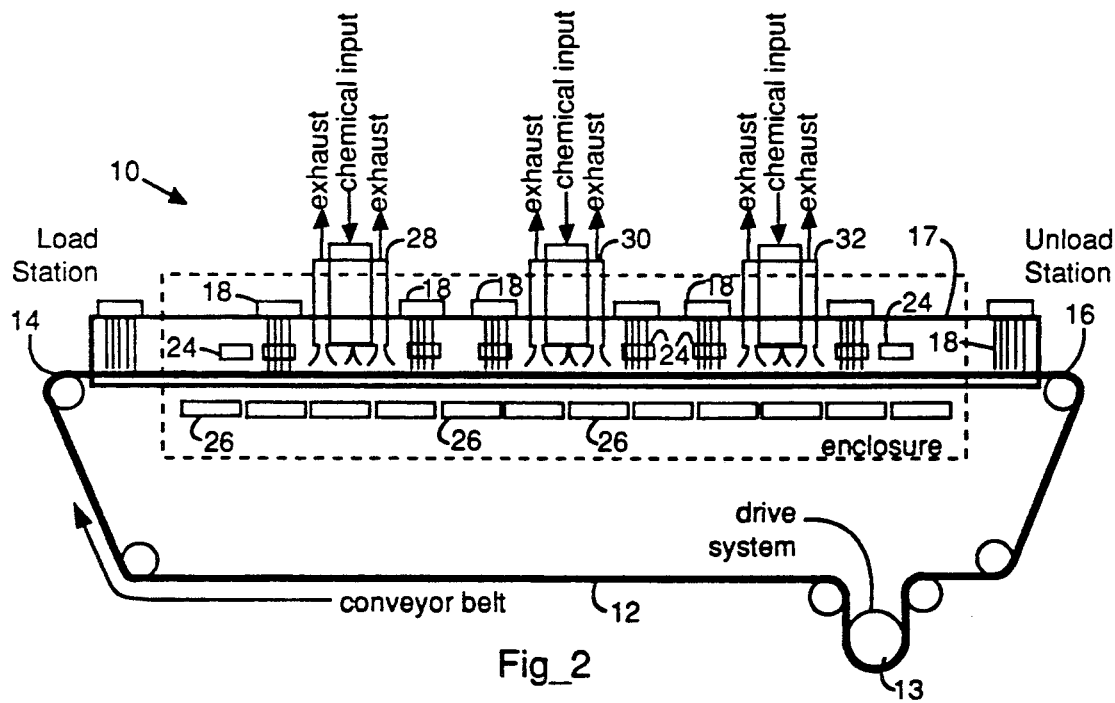
Fig_2

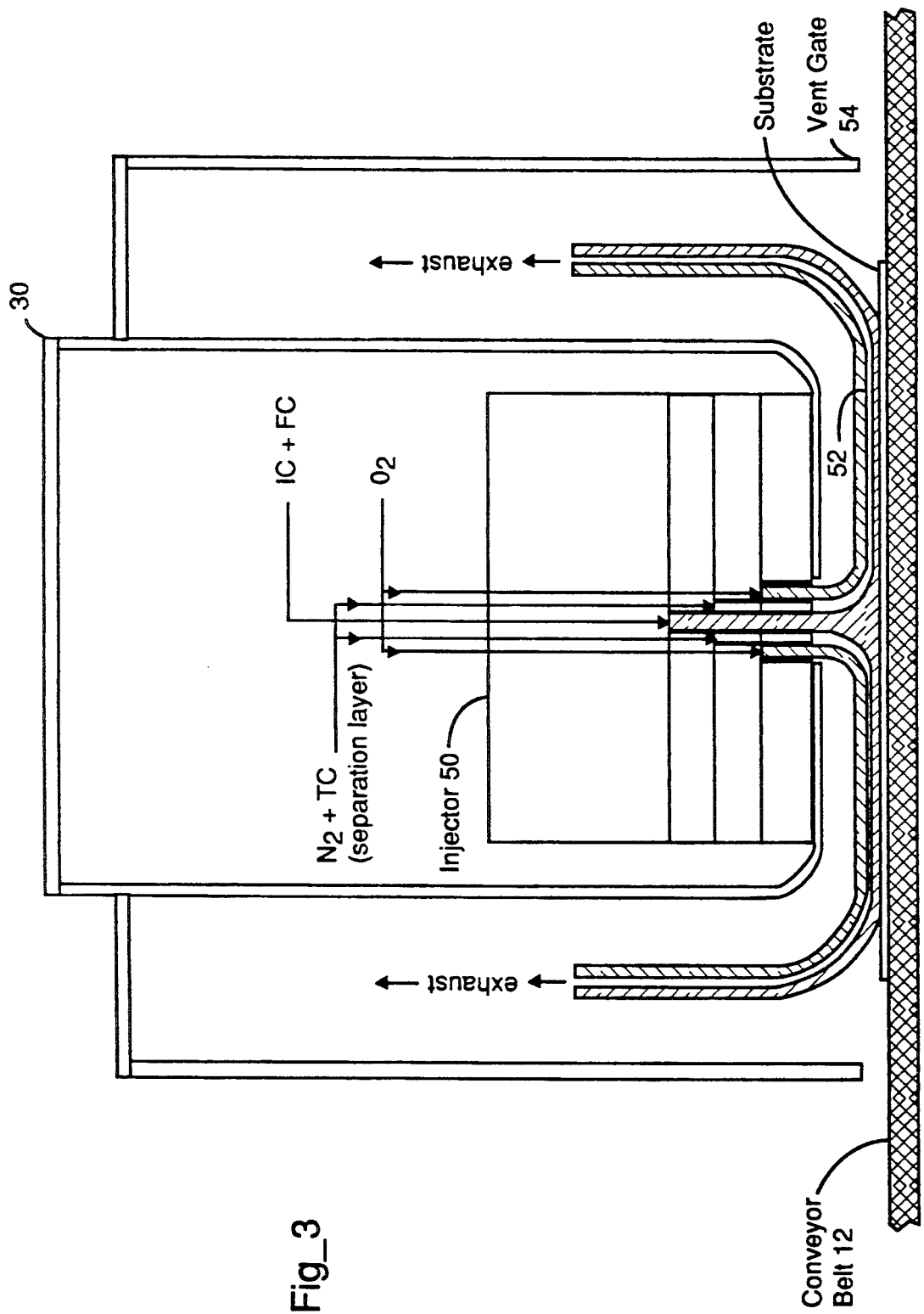

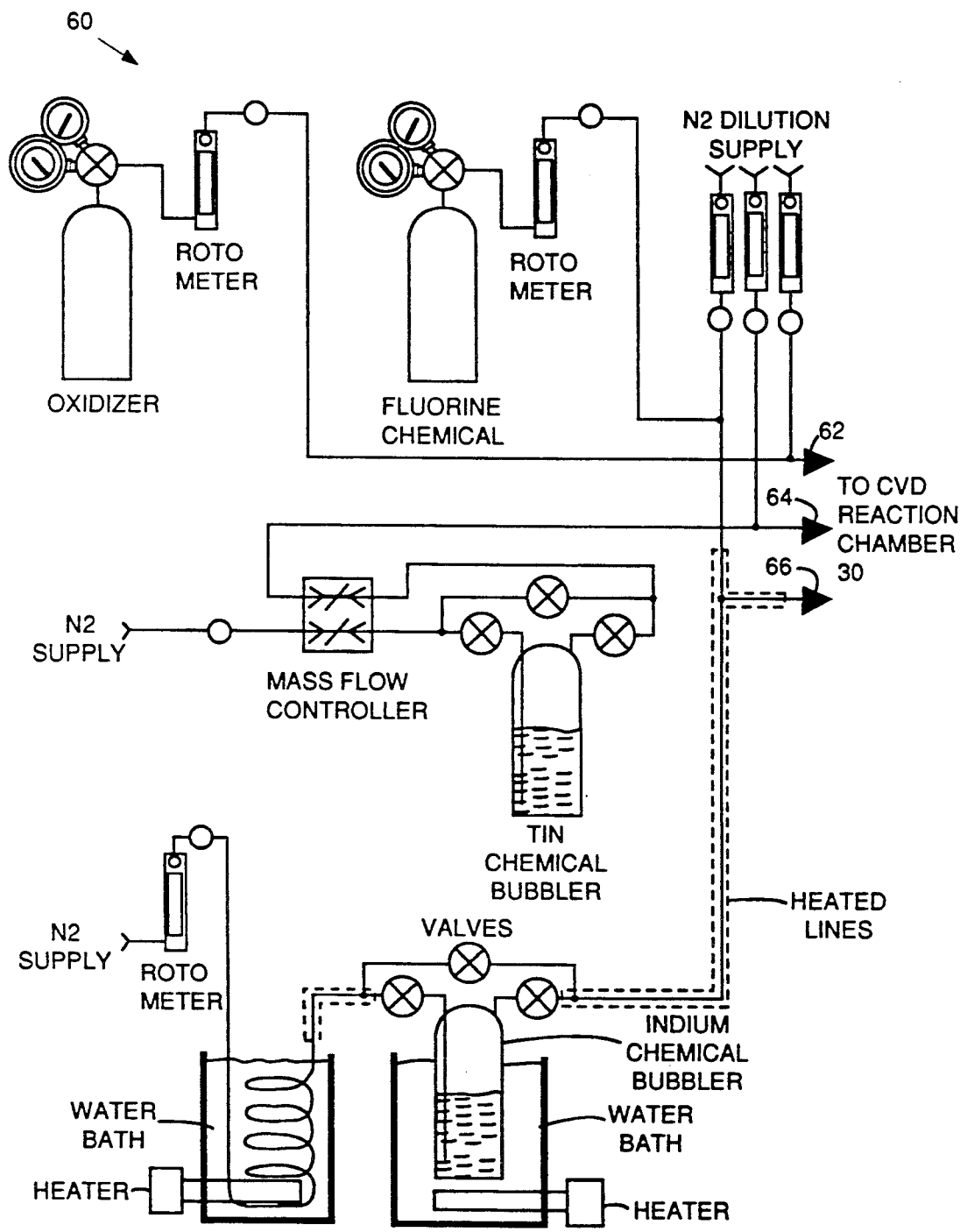
Fig_4

METHOD FOR PRODUCING HIGHLY CONDUCTIVE AND TRANSPARENT FILMS OF TIN AND FLUORINE DOPED INDIUM OXIDE BY APCVD

BACKGROUND OF THE INVENTION

1. Field of the Invention

The invention relates generally to producing thin films of tin and/or fluorine doped indium oxide and especially to doing so with atmospheric pressure chemical vapor deposition (APCVD) from the indium chemical sources of trimethylindium or trimethylindiumdiethyletherate, the tin chemical source tetramethyltin, the fluorine chemical source bromotrifluoromethane, and the oxygen sources of molecular oxygen ($O_2$) or water.

2. Description of the prior Art

Tin doped indium oxide (indium-tin-oxide, or ITO) films exhibit the relatively rare combination of transparency to light and good electrical conductivity. Transparent conductive oxides (TCOs), such as ITO films, are commonly used in liquid crystal, electroluminescent, plasma, and vacuum fluorescent information displays. TCOs are also useful in photocells and the gate electrodes in charge injection devices (CIDs) and charge coupled devices (CCDs) used in such places as video cameras. As transparent electrical resistors, such layers are used for defrosting windows in airplanes, cars, etc. The heat reflecting property of such films on glass substrates has been used to enhance the efficiency of solar thermal collectors, building windows, ovens, furnaces, sodium-vapor lamps, and fiberglass insulation.

Stannic oxide ($SnO_2$), indium oxide ($In_2O_3$), and cadmium stannate ($Cd_2SnO_4$) films have been produced by a wide variety of techniques that include sputtering, evaporation, and spray pyrolysis. U.S. Pat. No. 4,265,974, issued May 5, 1981, to Gordon provides a background of the many ways that have been used to produce transparent, electrically conductive coatings and layers. The earliest methods of applying these coatings were based on spraying a solution of a metal salt on a hot surface, such as glass. U.S. Pat. No. 2,617,745 describes a way to mitigate the fogging of the glass by applying a coating of pure silica on the glass. A problem with the uniformity and reproducibility in such coatings was addressed by controlling the humidity in the apparatus, in U.S. Pat. No. 2,651,585. Cleaner, more reproducible coatings have been attempted with vacuum deposition techniques, such as evaporation and sputtering. Semiconductor fabrication demands are more than enough to justify the higher costs associated with such techniques.

Impurities of tin, antimony, and fluorine in semiconductors will contribute to the conductivity of a device and can be deliberately introduced during the application of the above coatings and films. Fluorine has an advantage over antimony as a dopant for tin oxide, in that the transparency and conductivity of the fluorine-doped stannic oxide films is higher than that of the antimony-doped ones. Gordon points out that fluorine doping has only been demonstrated in the less satisfactory spray method. CVD, evaporation, and sputtering are not believed to have been shown to produce fluorine doping. The advantage of fluorine is important to solar cell and solar collector applications, among others. By using a spray method, Gillery, as described in U.S. Pat. No. 3,677,814, achieves one of the lowest resistivities in tin oxide films. Using a spray method, Gillery obtained fluorine-doped tin oxide films with resistances as low as fifteen ohms per square. Gordon observed that the lowest commercially available tin-oxide coated glass was, in 1979, in the range of forty ohms per square.

Further improvements in methods and equipment are needed to reduce the expense of vacuum deposition of tin-oxide and indium-oxide films and to improve both the electrical conductivity and visible light transparency.

Oxides of metals can usually be expected to act as good electrical insulators. Tin-oxide is no exception, however oxygen deficient tin-oxide exhibits a degree of electrical conductivity and is transparent to visible light when deposited as a film. Indium-oxide is another material that exhibits a degree of electrical conductivity and is transparent to visible light when deposited as a film. In a binary system the indium chemical, $In(CH_3)_3O(C_2H_5)_2$, reacts with molecular oxygen, $O_2$, in the theoretically stoichiometric way:

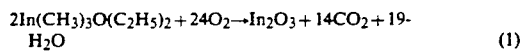

$$2In(CH_3)_3O(C_2H_5)_2 + 24O_2 \rightarrow In_2O_3 + 14CO_2 + 19\text{-}H_2O \quad (1)$$

In a first tertiary system tin (Sn) substitutes for indium (In) as a cation electron donor, such that electrical conductivity can be more reliably controlled in manufacturing, as in (2), below. Two minus "x" $In(CH_3)_3O(C_2H_5)_2$ molecules combine with "x" number of $Sn(CH_3)_4$ molecules, and an appropriate number of $O_2$ molecules to form indium-tin-oxide (ITO) with "x" number of tin atoms substituting for indium atoms.

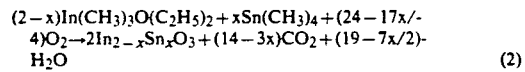

$$(2-x)In(CH_3)_3O(C_2H_5)_2 + xSn(CH_3)_4 + (24-17x/4)O_2 \rightarrow 2In_{2-x}Sn_xO_3 + (14-3x)CO_2 + (19-7x/2)H_2O \quad (2)$$

In a second tertiary system fluorine (F) substitutes for oxygen (O) as an anion electron donor, and is again such that electrical conductivity can be more reliably controlled in manufacturing, as in (3), below. Two $In(CH_3)_3O(C_2H_5)_2$ molecules combine with "y" divided by three number of $CF_3Br$ molecules, and an appropriate number of $O_2$ molecules to form indium-flourine-oxide (IFO) with "y" number of fluorine atoms substituting for oxygen atoms.

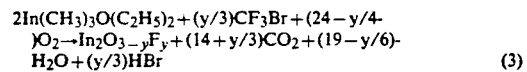

$$2In(CH_3)_3O(C_2H_5)_2 + (y/3)CF_3Br + (24-y/4)O_2 \rightarrow In_2O_{3-y}F_y + (14+y/3)CO_2 + (19-y/6)H_2O + (y/3)HBr \quad (3)$$

In a quaternary system that essentially combines reactions (2) and (3) above, tin (Sn) substitutes for indium (In), and fluorine (F) substitutes for oxygen (O) in a system resulting in dual electron donors. As shown in equation (4), below, two minus "x" number of $In(CH_3)_3O(C_2H_5)_2$ molecules combine with "x" number of $Sn(CH_3)_4$ molecules, and "y" divided by three number of $CF_3Br$ molecules, and an appropriate number of $O_2$ molecules to form indium-tin-oxide doped with fluorine (ITO:F) with "x" number of tin atoms substituting for indium atoms, and "y" number of fluorine atoms substituting for oxygen atoms.

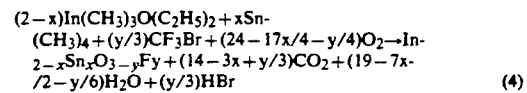

$$(2-x)In(CH_3)_3O(C_2H_5)_2 + xSn(CH_3)_4 + (y/3)CF_3Br + (24-17x/4-y/4)O_2 \rightarrow In_{2-x}Sn_xO_{3-y}F_y + (14-3x+y/3)CO_2 + (19-7x/2-y/6)H_2O + (y/3)HBr \quad (4)$$

The theoretical proportions of the various chemicals listed in equations (1) to (4) may, or may not, be realized in actual practice. The actual practical proportions for the chemicals depends upon the exact reaction conditions, and the reaction equipment used.

Such a system lends itself to continuous atmospheric pressure chemical vapor deposition techniques. The method and equipment embodiments of the present invention described below offer a practical and economical way to manufacture films on glass or other suitable substrates that are electrically conductive and transparent to visible light.

SUMMARY OF THE PRESENT INVENTION

It is therefore an object of the present invention to reduce the costs of equipment for vacuum deposition of doped and undoped indium-oxide films.

It is a further object of the present invention to improve both the electrical conductivity and visible light transparency of doped indium-oxide films.

Briefly, an atmospheric pressure chemical vapor deposition (APCVD) system for formation of indium oxide films doped with tin and fluorine; either singly or in combination. Such a film forms a solid state electronic system with either single-species, or dual species electron donors. The APCVD system has a conveyor belt and drive system for continuous processing through one or more reaction chambers separated by nitrogen purge curtains. (Typically, three reaction chambers are put in use.) A substrate passing through the system enters a muffle heated by several heaters and the reaction chambers are supplied by a source chemical delivery system comprising an oxidizer source, a fluorine chemical source, a nitrogen source, rotometers for the above sources, a mass flow controller, a tin chemical bubbler, heated lines, an indium chemical bubbler, a pair of water baths with heaters, and associated valving.

An advantage of the present invention is that continuous, rather than batch processing may be employed to deposit transparent, electrically-conductive thin films on glass substrates.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a top elevational view of preferred embodiment of the present invention that is an atmospheric pressure chemical vapor deposition (APCVD) system. For clarity the system enclosure is shown only as a dashed outline;

FIG. 2 is a cross-sectional view of the system of FIG. 1 taken along the line 2—2 in FIG. 1. The system enclosure is shown only as a dashed outline, and the bypass chambers are not shown so that the muffle can be illustrated clearly;

FIG. 3 is a cross-sectional view of the main reaction chamber of the APCVD system of FIG. 1; an FIG. 4 is a diagram of an exemplary source chemical delivery system for supplying source chemicals to the APCVD system of FIG. 1.

DETAILED DESCRIPTION OF THE PREFERRED EMBODIMENTS

FIGS. 1 and 2 illustrate a preferred embodiment of the present invention that is an atmospheric pressure chemical vapor deposition (APCVD) system, referred to by the general reference numeral 10, comprising a conveyor belt 12, a drive system 13, a load station 14, an unload station 16, a muffle 17, a plurality of nitrogen purge curtains 18, an inner bypass isolation chamber 20, an outer bypass isolation chamber 22, a plurality of bypass chamber vents 24, a plurality of heaters 26, a pre-process chamber 28, a main reaction chamber 30, a post-process chamber 32, and a system enclosure 34 (shown with dashed lines so that the other elements can be pictured here).

A substrate is placed on conveyor belt 12 at load station 14. The substrate is typically comprised of glass, but other materials are also practical. Conveyor belt 12 is continuously moving from station 14 to station 16 by virtue of drive system 13. Preferably, belt 12 moves about 380 mm/minute. As the substrate is drawn into muffle 17 it passes one of the nitrogen purge curtains 18 that isolate the gas atmospheres. As the substrate enters enclosure 34 it becomes heated to approximately 500° C. by heaters 26. Outer bypass isolation chamber 22 draws excess gasses through bypass chamber vents 24. The next curtain 18 seals the entrance to pre-process chamber 28 where a $SiO_2$ coating may be applied to the substrate. Such a coating is necessary as a diffusion barrier to highly mobile sodium atoms that exist in soda-lime glass, such as ordinary window glass. Sodium can poison the electrical conductivity of any film that may be laid down in later steps. Even if the substrate is low in sodium, or has no sodium at all, it may nevertheless be advantageous to lay down a pre-coat of $SiO_2$ to improve the surface finish and optical properties of the glass substrate. Two more nitrogen purge curtains 18 isolate chambers 28 and 30. The discussion below relating to FIG. 3 details how the indium-tin-oxide with fluorine (ITO:F) coating is applied to the substrate in main reaction chamber 30. Two more nitrogen purge curtains 18 isolate chambers 30 and 32. Post-process chamber 32 can be an additional ITO:F chamber to lay down thicker, more conductive films than is possible with just the single main reaction chamber 30. The substrate then exits past two more nitrogen purge curtains 18 and cools down as it reaches unload station 16.

Due to the extraordinary length of the names of some of the chemical compositions used here, the text below and some of the Figs. use the abbreviations "IC", "FC", and "TC". The indium chemical is abbreviated "IC" and preferably comprises either trimethylindium-diethyletherate or trimethylindium. The trimethylindium is commercially and readily available and is slightly more costly than the trimethylrndium-diethyletherate. However, tests have indicated that trimethylindiumdiethyletherate can be used to produce films having slightly better performance characteristics. A mixture of both may also be used. Otherwise, both chemicals are superior to other sources of indium known to the inventor. The tin chemical is abbreviated "TC" and preferably comprises tetramethyltin (TMT). Tin-2-ethylhexanoate has been tried for the TC, but using TMT produces far better results. The fluorine chemical is abbreviated "FC" and comprises bromotrifluoromethane, which is also known as $CF_3Br$, and is sold commercially as FREON 13B1. The oxygen source is preferably water vapor or pure oxygen ($O_2$), and the best results have been obtained when using oxygen. The chemicals and methods described here allow the source chemical delivery system to be operated at temperatures under 200° C.

FIG. 3 details main reaction chamber 30 in system 10. If gas IC is simply exposed to air a useless white powder will be formed. It is crucial in a continuous APCVD process to control the introduction of IC and oxygen to each other and to the surface of a substrate to be coated. Reaction chamber 30 comprises an injector 50 that establishes a laminar gas flow 52 over the surface of the substrate. A relatively inert vapor phase TC and nitrogen mixture separates the highly reactive vapor phase IC from the oxygen until surface reaction favoring mechanisms begin. A chemical input from a source chemical delivery system (described below) supplies IC and FC in their vapor phase through injector 50 to a first gas lamination that is in contact with the heated substrate. The vapor phase IC becomes adsorbed (stuck on the surface of the substrate). A second gas lamination of nitrogen ($N_2$) and TC then controls the rate that oxygen ($O_2$) from a third gas lamination can pass through to react with the adsorbed layer to form the desired film. (See, Gralenski, N. M., "Advanced APCVD Reactors for Thin Film Deposition," *Microelectronics Manufacturing and Testing*, Sep./Oct.1987; and, "Thin Films by Conveyorized Atmospheric CVD," presented at the International Society for Hybrid Microelectronics-Internepcon Technical Seminar, Jan.1983.) The theoretical chemistry for the resulting reaction is given above in equation (4). The delivery of chemicals to the surface of the substrate in the above manner allows the use of the conveyor belt 12 in a non-batch process. Prior art deposition equipment require batch processes that are expensive due to the fact that batches must be prepared, run, and removed. Each operation more or less interferes with the others. Continuous CVD processes allow uninterrupted processing and maximum efficiency.

FIG. 4 illustrates a source chemical delivery system (SCDS) 60 able to supply the necessary chemical inputs to APCVD system 10. SCDS 60 comprises an oxidizer source, a fluorine chemical source, a nitrogen source, rotometers for the above sources, a mass flow controller, a tin chemical bubbler, heated lines, an indium chemical bubbler, a pair of water baths with heaters, and associated valving. The arrangement and use of such a chemical delivery system is considered to be routine and familiar to a person skilled in the art. SCDS 60 supplies oxygen from an output line 62, TC and nitrogen from an output line 64, and FC and IC from an output line 66.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method for applying transparent and electrically conductive thin films on substrates in a continuous process, comprising the steps of:
   moving one or more substrates along a continuous conveyor;
   introducing said substrates into an inert atmosphere isolated from the outside room atmosphere;
   heating said substrates;
   introducing said substrates into a chemical reaction chamber having gas injection means for establishing a first laminar flow of a material that can be adsorbed onto surfaces of said substrates, a second laminar flow of a gas adjacent to said first laminar flow such that said material is temporarily isolated from an oxidizer, and a third laminar flow of an oxidizing gas;
   forming said thin film on said surfaces of said substrate by reacting materials from said first, second and third laminar flows; and
   cooling said substrates.

2. The method of claim 1, wherein:
   said first laminar flow comprises a mixture of bromotrifluoromethane and at least one of trimethylindiumdiethyletherate or trimethylindium, said second laminar flow comprises a mixture of nitrogen and tetramethyltin, and said third laminar flow comprises oxygen.

3. A method of making an electrically conductive transparent thin film on a substrate, comprising the steps of:
   supplying a mixture of bromotrifluoromethane and at least one of trimethylindiumdiethyletherate and trimethylindium in their vapor phases to the surface of the substrate such that indium becomes adsorbed onto the surface of the substrate;
   covering the surface of the substrate with a mixture of nitrogen and tetramethyltin in its vapor phase; and
   exposing said covered surface to an oxidizer such that indium oxide doped with tin and fluorine atoms produces a thin film having dual electron donors wherein electrical conduction may be supported.

4. The method of claim 3, further comprising the steps of:
   heating the substrate in an inert atmosphere before any of the above steps; and
   cooling the substrate after the above steps are completed.

5. The method of claim 3, further comprising the step of:
   moving the substrate along a continuous conveyor belt in a single direction during the steps of supplying, covering, and exposing, such that substrates without thin film coatings can be input at one end of said conveyor belt and substrates with thin film coatings can be removed at the opposite end.

6. The method of claim 5, further comprising the steps of:
   isolating a place or places where the steps of supplying, covering, and exposing occur isolated from the outside room atmosphere such that substantially pure concentrations of the chemicals supplied from a source chemical delivery system and used in the steps of supplying, covering, and exposing exist.

7. The method of claim 6, wherein:
   the isolation comprises the use of nitrogen purge curtains and a heated muffle.

8. A method of manufacturing indium-oxide doped with tin and fluorine at approximately 500° C. process temperatures, comprising the steps of:
   heating nitrogen in a water bath and using the heated nitrogen in a chemical bubbler containing at least one of trimethylindiumdiethyletherate or trimethylindium mixed with bromotrifluoromethane to produce a first gas, said heating not exceeding 200° C.;

passing nitrogen through a mass flow controller and chemical bubbler containing tetramethyltin to produce a second gas;

introducing an oxidizing gas as a third gas; and combining said first, second, and third gases to produce a thin film of indium-oxide doped with tin and fluorine on the surface of a suitable substrate.

* * * * *

UNITED STATES PATENT AND TRADEMARK OFFICE
CERTIFICATE OF CORRECTION

PATENT NO. : 5,122,391
DATED : June 16, 1992
INVENTOR(S) : Mayer et al.

It is certified that error appears in the above-identified patent and that said Letters Patent is hereby corrected as shown below:

On the Title Page, item [75], "Inventor:":
    change "Inventor:" to -- Inventors: --; and
    delete "Calif." and add -- ; M. Dean Matthews, Saratoga; both of Calif. --.

Signed and Sealed this

Tenth Day of April, 2001

Attest:

NICHOLAS P. GODICI

*Attesting Officer*      *Acting Director of the United States Patent and Trademark Office*